United States Patent [19]

Wieder et al.

[11] 4,314,873
[45] Feb. 9, 1982

[54] METHOD FOR DEPOSITING HETEROEPITAXIALLY INP ON GAAS SEMI-INSULATING SUBSTRATES

[75] Inventors: Herman H. Wieder, San Diego, Calif.; Charles R. Parkerson, Green Mountain Falls, Colo.

[73] Assignee: The United States of America as represented by the Secretary of the Navy, Washington, D.C.

[21] Appl. No.: 812,965

[22] Filed: Jul. 5, 1977

[51] Int. Cl.³ .............................................. C30B 25/02
[52] U.S. Cl. ............................. 156/610; 156/DIG. 70
[58] Field of Search ....... 156/613, 610, 601, DIG. 70; 427/86; 148/176

[56] References Cited

U.S. PATENT DOCUMENTS

| | | | |
|---|---|---|---|
| 3,351,502 | 11/1967 | Rediker | 156/610 |
| 3,963,539 | 6/1976 | Kemlage et al. | 156/613 |
| 3,993,533 | 11/1976 | Milnes et al. | 156/613 |

OTHER PUBLICATIONS

J. Electrochem. Soc., 11/70, vol. 117 No. 11, 1417-1419, Allen.

Primary Examiner—Hiram Bernstein
Attorney, Agent, or Firm—R. F. Beers; E. F. Johnston; Thomas M. Phillips

[57] ABSTRACT

A method for depositing high quality indium phosphide layers heteroepitaxially on GaAs substrates by controlling the growth between them of an interfacial quaternary alloy of $In_yGa_{1-y}As_xP_{1-x}$.

5 Claims, 3 Drawing Figures

METHOD FOR DEPOSITING HETEROEPITAXIALLY INP ON GAAS SEMI-INSULATING SUBSTRATES

BACKGROUND OF THE INVENTION

The epitaxial layers suitable for field effect transistors (FET) and transferred electron (TED) Gunn effect devices must contain very few lattice imperfections because crystalline lattice imperfections reduce their electron mobilities and the latter represent one of the principal figures of merit of FET and TED. This can be achieved only if the lattice constant of the epitaxial layers are matched to better than 0.1% to their substrates. A further requirement is that these substrates be semi-insulating so as to prevent short circuiting of the active devices or parasitic coupling between them or other circuit elements. The best semi-insulating InP presently available is not satisfactory; its resistivity in some three to four orders of magnitude smaller than that of semi-insulating galium arsenide GaAs. It would then be desirable to deposit or grow InP layers epitaxially on semi-insulating GaAs. Semi-insulating GaAs and InP have different lattice constants. The lattice constant mismatch between them is 3.89%. Semi-insulating InP cost is considerably more costly than semi-insulating GaAs and is not readily available.

SUMMARY OF THE INVENTION

In order to overcome the above noted disadvantages, the present invention provides a method of lattice matching two different binary alloys of the form AB and CD, respectively, each having a different lattice constant by depositing one upon the other using a vapor phase heteroepitaxial process. A compositional graded intermediate quaternary layer of the form $A_yC_{1-y}B_xD_{1-x}$ is grown in between the two binary alloys where x and y are atomic fractions of the constitutents.

This method was used for depositing heteroepitaxially InP on GaAs semi-insulating substrates. The InP layers were grown on (100)- and (111)B-oriented semi-insulating GaAs by means of the hydride vapor phase epitaxy (VPE) process. The indium source zone was held at 860° C. and the substrate zone was heated to a temperature controlled to a plus or minus 1° C. between 600° C. and 650° C. The constitutent gases and reaction products were transported at a velocity of 14 to 48 cm./min. and the $PH_3$/HCl used were between 0.83 and 1.39. The thickness of the epilayers were measured by delineating the optical contrast of the epilayer substrate interface by cleaning the specimens and then immersing them for fifteen seconds in a solution of 1% (by volume) of 5% NaOCl to forty parts deionized water.

An object of the invention is the use of a quaternary alloy to provide graded layer lattice matching between a substrate and an epitaxial layer with different lattice variants.

Another object of the invention is to provide a controlled thickness of compositionally graded interface between the semiinsulating GaAs and the conducting InP epitaxial layer so as to minimize or eliminate the formation of misfit dislocations in the InP layer.

A further object of the invention is the use of a quaternary alloy of $Ga_xIn_{1-x}As_yP_{1-y}$ to provide a graded composition lattice match between GaAs and InP so that the fractional atomic content of Ga and As decreases from GaAs towards the InP surface to provide an appropriate lattice match.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
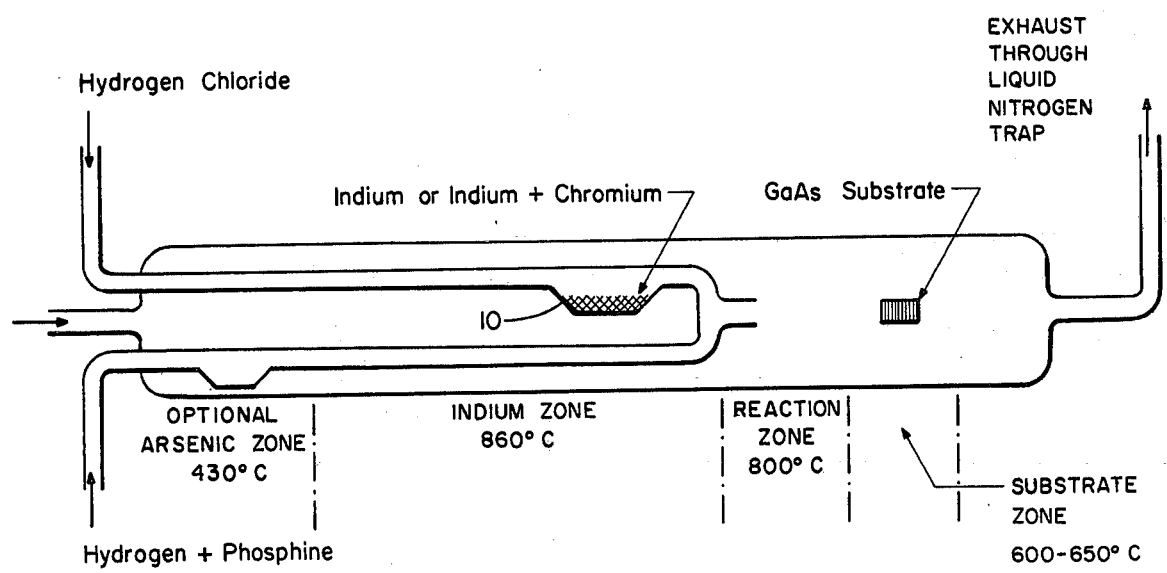
FIG. 1 shows apparatus for growing crystals using the hydride vapor phase epitaxy process.

Referring now to FIG. 1 there is shown schematically a reaction apparatus used for growing InP layers on GaAs substrates and is referred to as an open tube, constant pressure, thermally-induced disproportionation process.

In order to make the interfacial region semi-insulating the layers are grown in a two stage process. First, an interfacial buffer layer is grown but instead of pure indium, the material placed within the indium well 10 of FIG. 1 contains an alloy of indium and iron or indium and chromium previously melted together in the same enclosure in a vacuum environment. The amount of iron or chromium required is approximately 1% by weight of the quantity of indium. The effect of the iron or chromium included in the growing layer is to compensate the electron donor impurities in the interfacial region reducing the conductivity of the interfacial buffer layer and making it semi-insulating. The interfacial region should be from 0.3 μm to 10 μm in thickness. The second stage of the process is that of growing a pure indium phosphide film upon the semi-insulating buffer layer as shown in the apparatus of FIG. 1.

The InP layers grown according to the present invention were grown on (100)- and (111)B-oriented semi-insulating GaAs and were prepared by means of the hydride VPE Process. The In source zone was held at 860° C. while the substrate zone was heated to 625° C. and controlled to ±1° C. The constituent gases and reaction products were transported at a velocity of 14 to 48 cm/min. and the $PH_3$/HCl ratios used were between 0.83 and 1.39. In order to measure the thickness of the epilayers and for delineating the optical contrast of the epilayer-substrate interface, specimens were cleaved and then immersed for 15 sec. in a solution of 1% (by volume) of 5% NaOCl to 40 parts deionized water.

Figure 2:
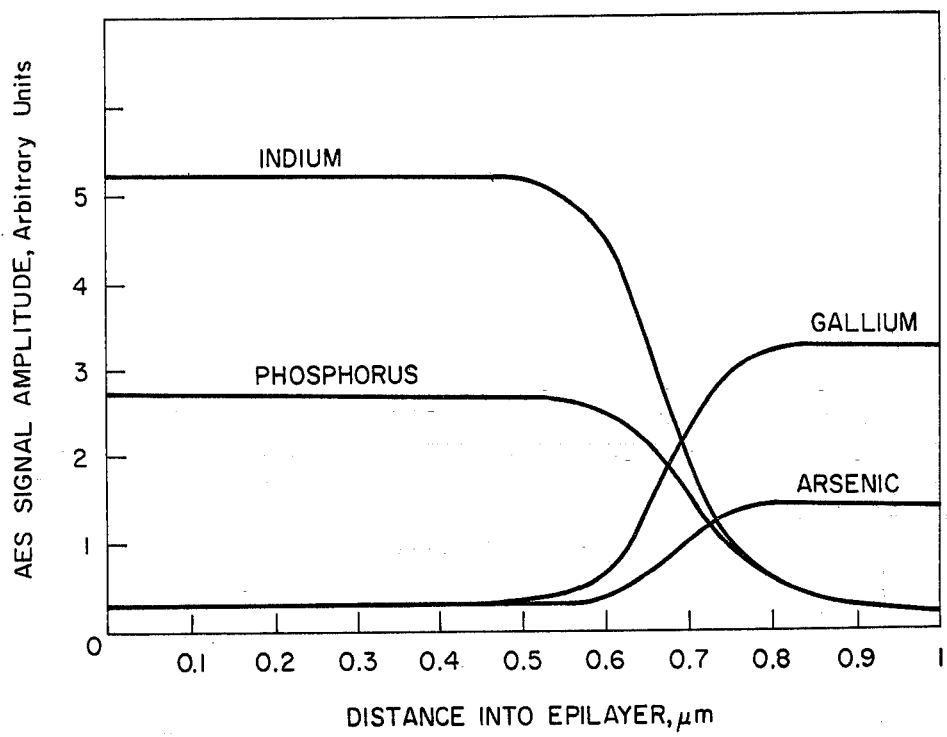
FIG. 2 is a graph of a compositional profile of heteroepitaxial interface of (100)-oriented InP epilayer obtained by Auger electron spectroscopy and sputter-etching.

The compositional grading at the interface of heteroepitaxial InP layers was determined by means of Auger electron spectrometry (AES). FIG. 2 shows the profile of a 0.8 m-thick (100)-oriented epilayer determined by AES and sputter-etching. The constituents are shown as a function of distance from the epilayer surface, calibrated in terms of the ion etching time. A different portion of the same epilayer was subjected to a sequential repeated anodization and etch-stripping of the anodized layer to produce a series of steps of varying thickness. The AES surface composition of each step and the AES sputter-etching of each step confirmed the data shown in FIG. 2.

Figure 3:
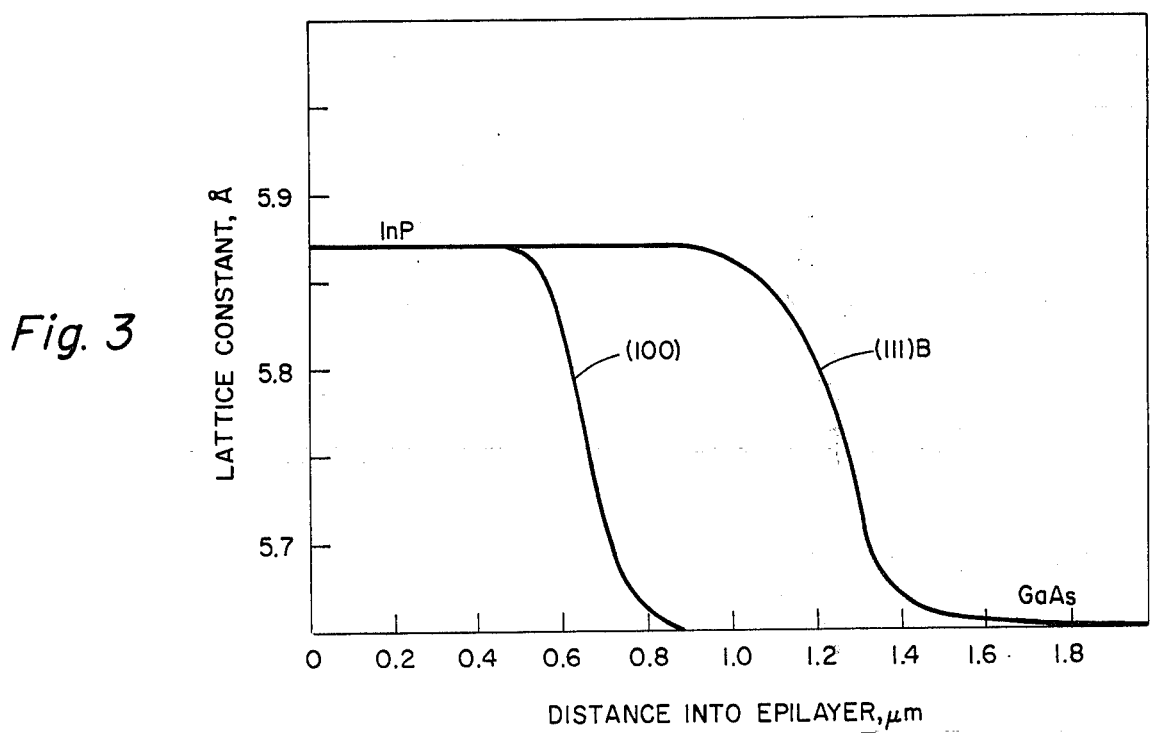
FIG. 3 is a graph of calculated lattice constants of ordinary $In_yGa_{1-y}As_xP_{1-x}$ alloy at heteroepitaxial interface between (100)- and (111)B-oriented InP epilayers at a function of depth from epilayer surface.

The compositional grading is considered to arise from the diffusion of In and P into the GaAs substrate. FIG. 3 shows the lattice constant dependence on distance (with respect to the epilayer surface) of the quaternary alloy $Ga_yIn_{1-y}As_xP_{1-x}$ of FIG. 2, calculated from the equation $$a_o(\text{Å}) = 5.87 + 0.18x - 0.42y + 0.02xy$$

derived by Moon et al, Journal of Electron Matter, 3, 635 (1974). It shows a relatively sharp gradient extending over approximately 0.25 μm. The thickness of the epilayer of 0.8 μm, measured by optical contrast apparently includes the compositionally graded layer. A similar AES analysis made of a 2 m-thick InP epilayer on (111)B-oriented GaAs is also shown in FIG. 3. Its principal gradient is considered to extend over approximately 0.4 m and is less steep than that of the (100)-oriented epilayer.

Obviously many modifications and variations of the present invention are possible in the light of the above teachings. It is therefore to be understood that within the scope of the appended claims the invention may be practiced otherwise than as specifically described.

What is claimed is:

1. A method of lattice matching two different binary alloys having different lattice constants, comprising the steps of (a) selecting a first binary alloy of the form AB, said first binary alloy being InP, (b) selecting a second binary alloy of the form CD, said second binary alloy being GaAs, (c) depositing said first binary alloy upon said second binary alloy using a vapor heteroepitaxial process, (d) controlling the composition and the velocity of the constituent gases and reaction products and the temperature of the source and substrate zones of said process to form a compositional graded intermediate quaternary layer of the form $A_yC_{1-y}B_xD_{1-x}$ where x and y are atomic fractions of the constituents in between said binary alloys, said quaternary layer being $In_yGa_{1-y}As_xP_{1-x}$, wherein the indium source zone is held at 860° C. and the substrate zone is heated to a temperature in the range of 600° to 650° C. and controlled to ±1° C. and the constituent gases and products are transported at a velocity in the range of 14 to 48 cm/min.

2. The method of claim 1 wherein said second binary alloy is (100)-oriented semi-insulating GaAs.

3. The method of claim 1 wherein said second binary alloy is (111)B-oriented semi-insulating GaAs.

4. The method of claim 1 wherein the interfacial quaternary layer is made semi-insulating and to compensate for residual impurities in the quaternary alloy layer, chromium doped indium is selected as the indium source.

5. The method of claim 1 wherein the interfacial quaternary layer is made semi-insulating and to compensate for residual impurities in the quaternary alloy layer, iron doped indium is selected as the indium source.

* * * * *